United States Patent
Nakajima et al.

(10) Patent No.: US 7,015,127 B2
(45) Date of Patent: Mar. 21, 2006

(54) SEMICONDUCTOR DEVICE AND A METHOD OF MANUFACTURING THE SAME

(75) Inventors: Yasuyuki Nakajima, Tachikawa (JP); Toshiaki Morita, Hitachi (JP); Tomoo Matsuzawa, Tokyo (JP); Seiichi Tomoi, Kodaira (JP); Naoki Kawanabe, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/408,119

(22) Filed: Apr. 8, 2003

(65) Prior Publication Data

US 2004/0142551 A1    Jul. 22, 2004

Related U.S. Application Data

(62) Division of application No. 10/369,766, filed on Feb. 21, 2003, now abandoned.

(30) Foreign Application Priority Data

Mar. 7, 2002    (JP) ............................. 2002-061765

(51) Int. Cl.
    *H01L 21/44*    (2006.01)
(52) U.S. Cl. ................... 438/612; 438/118; 438/617
(58) Field of Classification Search ................ 438/617, 438/106, 612, 118, 613
    See application file for complete search history.

(56) References Cited

U.S. PATENT DOCUMENTS

| 4,891,333 | A  | * | 1/1990  | Baba et al. ................... 29/827 |
| 5,525,546 | A  | * | 6/1996  | Harada et al. ............. 438/612 |
| 5,699,953 | A  | * | 12/1997 | Safabakhsh .............. 228/110.1 |
| 6,507,112 | B1 | * | 1/2003  | Kurihara et al. ............ 257/734 |

* cited by examiner

*Primary Examiner*—David Nelms
*Assistant Examiner*—Quoc Hoang
(74) *Attorney, Agent, or Firm*—Mattingly, Stanger, Malur & Brundidge, P.C.

(57) ABSTRACT

Provided is a semiconductor device comprising a first metal film formed above a semiconductor chip, a ball portion formed over said first metal film and made of a second metal, and an alloy layer of said first metal and said second metal which alloy layer is formed between said first metal film and said ball portion, wherein said alloy layer reaches the bottom of said first metal film, and said ball portion is covered with a resin; and a manufacturing method thereof. The present invention makes it possible to improve adhesion between the bonding pad portion and ball portion of a bonding wire over an interconnect, thereby improving the reliability of the semiconductor device.

3 Claims, 19 Drawing Sheets

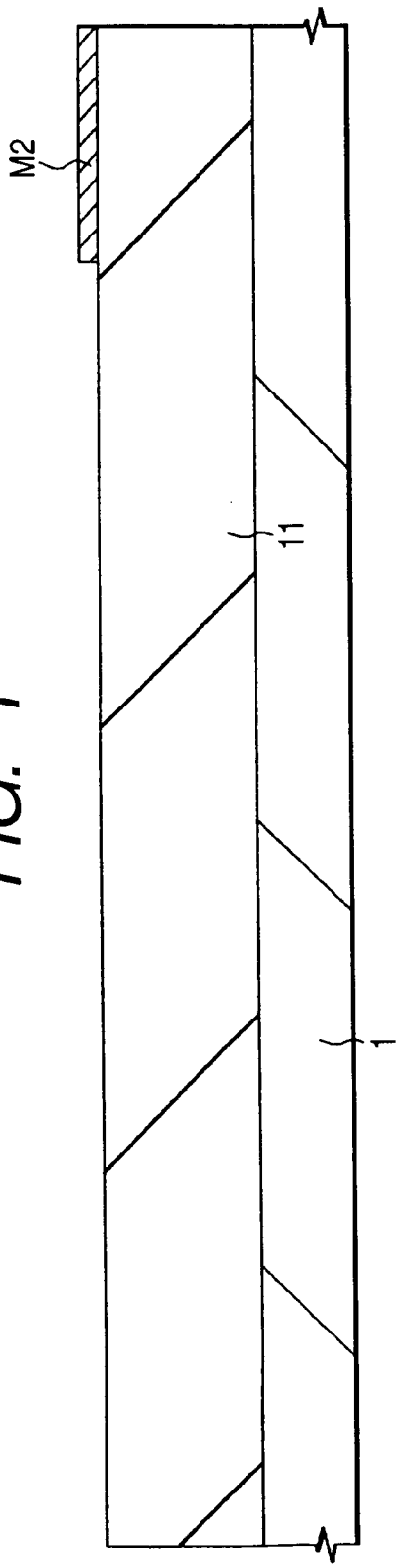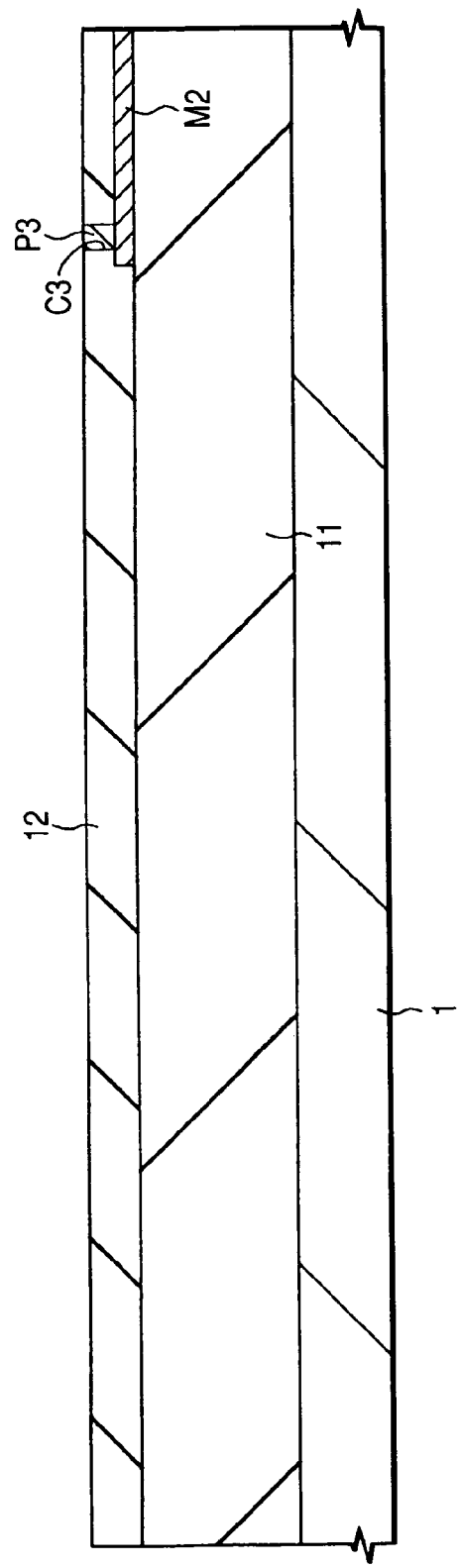

SEMICONDUCTOR DEVICE AND A METHOD OF MANUFACTURING THE SAME

This is a divisional application of U.S. Ser. No. 10/369,766, filed Feb. 21, 2003 now abandoned.

BACKGROUND OF THE INVENTION

The present invention relates to a semiconductor device and a manufacturing method thereof, particularly to a technique effective when applied to a semiconductor device having a wire for connecting a semiconductor chip (pellet) with an external connecting terminal and a manufacturing method thereof.

It is necessary to take out inputs and outputs of electric signals in order to allow an IC (Integrated Circuit) chip to function. For this purpose, usable is a packaging method of connecting the bonding pad portion of the IC chip with an external lead terminal of lead frame or the like with a gold wire (bonding wire) and then sealing the IC chip and gold wire with a resin.

For example, disclosed in Japanese Patent Application Laid-Open No. Hei 1(1989)-215030 is a technique of preventing cracks (14) appearing at the lower part of the bonding pad of a semiconductor device, which has been obtained by connecting a semiconductor pellet with a lead frame via a connecting wire and then sealing with a resin, by adjusting a ratio (t/S) of the thickness (t) of the ball portion at the tip of the wire to a bonding width (S) at 0.2 or less.

SUMMARY OF THE INVENTION

The present inventors have been engaged in the research and development of semiconductor devices and they have adopted the above-described packaging method of a semiconductor device using a gold wire and a resin.

For example, a package is completed by melting and contact-bonding (first bonding) one end of a gold wire onto a bonding pad portion which is an uppermost exposed portion of an Al film (interconnect) of an IC chip to connect the IC chip with the gold wire; thermo-compression bonding (second bonding) another end of the gold wire onto an external connecting terminal on a wiring substrate; and sealing the IC chip, gold wire and the like with a resin.

In such a packaging method, the Al film (interconnect) and the tip (ball portion) of the gold wire are connected by the formation of an alloy, on the bonding pad portion, between aluminum and gold.

Owing to an increase in the number of pins (the number of external connecting terminals) with the diversification of the functions of LSI (Large Scale Integrated Circuit), and moreover a tendency toward high integration in LSI, the pitches of these pins (external connecting terminals) become increasingly narrow. In addition, with miniaturization of LSI, interconnects each tends to be thinner.

When the above-described bonding method was applied to such a highly-integrated device with diversified functions, short-circuit failures occurred frequently after a temperature cycle test for evaluating (testing) the durability of a semiconductor device.

The present inventors have carried out an extensive investigation on such a failure and as a result, have found that a destruction phenomenon (cracks) in the aluminum-gold alloy layer is a cause of the failure. They have proceeded with a further investigation, because cracks at the lower part of the bonding pad portion occupy the major part of the destruction phenomenon in the aluminum-gold alloy layer as shown in the above-described Japanese Patent Laid-Open No. Hei 1(1989)-215030. As will be described later in detail, the mode of the aluminum-gold alloy layer is different from that of the conventional one.

An object of the present invention is to improve the adhesion between the bonding pad portion (interconnect) with the ball portion, particularly, to maintain sufficient adhesion between the interconnect and the ball portion even if the film thickness of the interconnect is small.

Another object of the present invention is to improve the reliability of the semiconductor device by improving the adhesion between the interconnect and ball portion, and also to improve a yield of the semiconductor device.

A further object of the present invention is to provide a technique desirable when applied to a semiconductor device having bonding pads disposed with small pitches, and a manufacturing method thereof.

The above-described and novel features of the present invention will be apparent from the description herein and accompanying drawings.

Of the inventions disclosed by the present application, typical ones will next be described briefly.

(1) A semiconductor device of the present invention has a first metal film formed above a semiconductor chip, a ball portion formed over the first metal film and made of a second metal, and an alloy layer of the first metal and the second metal formed between the first metal film and the ball portion to reach the bottom of the first metal film. The ball portion may be covered with a resin. The relationship between the height h of the ball portion and the maximum peripheral diameter D of the ball may satisfy the following expression: $9 \geq D/h \geq 2$.

(2) A semiconductor device of the present invention has a first metal film formed above a semiconductor chip, a ball portion formed over the first metal film and made of a second metal, and an alloy layer of the first metal and the second metal formed between the first metal film and the ball portion. A diameter d of a contact region of the first metal film with the ball portion and a diameter g of the alloy layer formed region satisfies the following expression: $g \geq 0.8d$. The diameter d of a contact region of the first metal film with the ball portion and the maximum peripheral diameter D of the ball may satisfy the following expression: $d \geq 0.8D$.

(3) A manufacturing method of a semiconductor device according to the present invention comprises forming, over a first metal film above a semiconductor chip, an insulating film having an opening at a pad portion, and adhering a ball portion made of a second metal onto the pad portion by ultrasonic thermo-compression bonding method using a ultrasonic wave having a frequency of 110 kHz or greater.

(4) A manufacturing method of a semiconductor device according to the present invention comprises forming, over a first metal film above a semiconductor chip, an insulating film having an opening at a pad portion, and adhering a ball portion, which is formed over the first metal film and is made of a second metal, onto the pad portion by forming an alloy layer of the first metal and the second metal in at least 70% of a contact region of the first metal film with the ball portion. After the ball portion is covered with a resin or the semiconductor chip covered with the resin is exposed to high temperature conditions, the characteristics of the semiconductor chip may be tested. The ball portion made of the second metal may be shaped so that the diameter d of the contact region and the maximum peripheral diameter D of the ball portion would satisfy the following expression: $d \geq 0.8D$.

BRIEF DESCRIPTION OF THE DRAWINGS

FIG. 1 is a fragmentary cross-sectional view of a substrate illustrating a manufacturing step of a semiconductor device according to an embodiment of the present invention;

FIG. 2 is a fragmentary cross-sectional view of a substrate illustrating a manufacturing step of the semiconductor device according to the embodiment of the present invention;

DETAILED DESCRIPTION OF THE PREFERRED EMBODIMENTS

Figure 3:
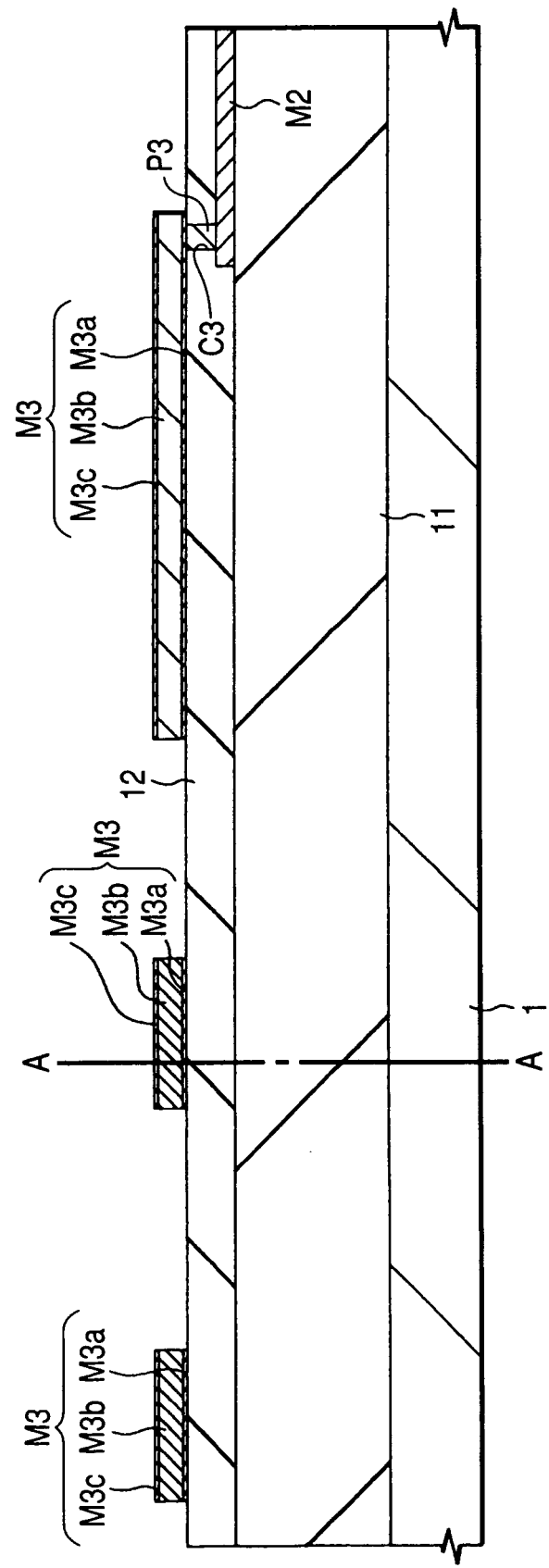
FIG. 3 is a fragmentary cross-sectional view of a substrate illustrating a manufacturing step of the semiconductor device according to the embodiment of the present invention.

Embodiments of the present invention will hereinafter be described specifically based on accompanying drawings. In all the drawings for describing the below-described embodiments, elements having like function will be identified by like reference numerals and overlapping descriptions will be omitted.

The semiconductor device (semiconductor integrated circuit device) according to the embodiment of the present invention will next be described following its manufacturing method.

As illustrated in FIG. 1, a semiconductor substrate 1 having formed thereon a silicon oxide film 11 and a second-level interconnect M2 is prepared. In the silicon oxide film 11, a semiconductor element such as MISFET (Metal Insulator Semiconductor Field Effect Transistor), first-level interconnect, a plug for connecting the element with the first-level interconnect, a plug for connecting the first-level interconnect with a second-level interconnect which will be described later, and the like are formed, but they are not illustrated. In the semiconductor substrate 1, an element isolation made of, for example, a silicon oxide film is formed as needed, but its illustration is also omitted.

As illustrated in FIG. 2, a silicon oxide film 12 is deposited over the second-level interconnect M2 by CVD (Chemical Vapor Deposition) as an interlevel insulating film. Then, a contact hole C3 is formed by removing the silicon oxide film 12 over the second-level interconnect M2 by dry etching. Over the silicon oxide film 11 including the inside of the contact hole C3, a tungsten (W) film, for example, is deposited as a conductive film by CVD. The W film outside the contact hole C3 is removed, for example, by CMP (Chemical Mechanical Polishing) to form a plug P3.

Figure 4:
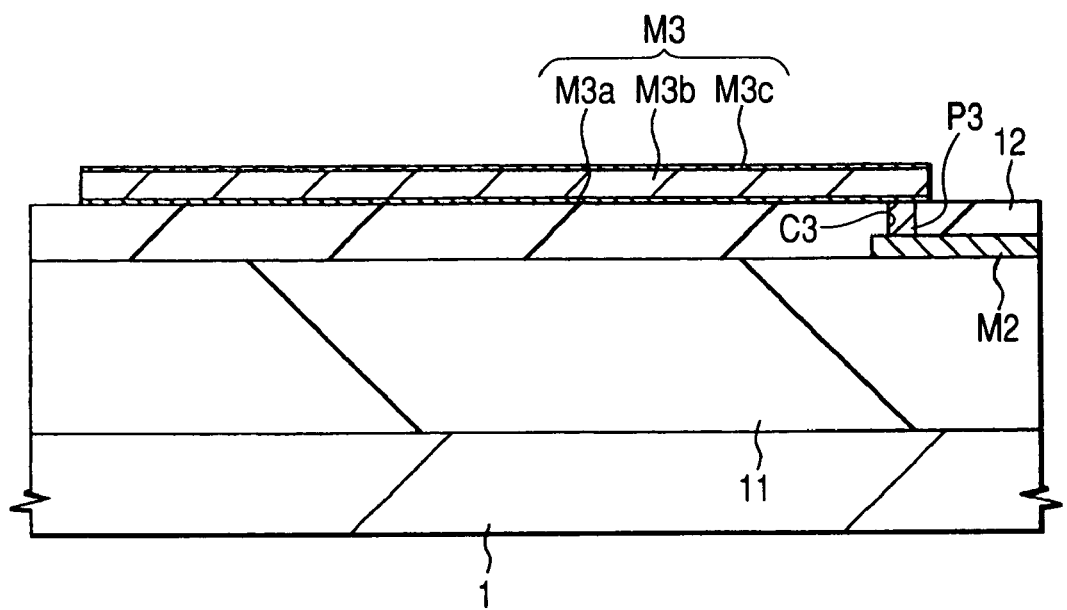
FIG. 4 is a fragmentary cross-sectional view of a substrate illustrating a manufacturing method of the semiconductor device according to the embodiment of the present invention.

As illustrated in FIGS. 3 and 4, over the silicon oxide film 12 including the upper surface of the plug P3, a TiN (titanium nitride) film M3a of about 50 nm thick, an Al (aluminum) film M3b of about 700 nm thick and a TiN film M3c of about 50 nm thick are deposited as conductive films successively, for example, by sputtering. The term "Al film" as used herein means a film having Al as a main component and it embraces an alloy film of Al with another metal.

The TiN films M3a and M3c are formed in order to ensure the reliability of an interconnect by 1) heightening adhesion between the Al film M3b and an insulating film such as the silicon oxide film 12, or by 2) improving electromigration resistance of the second-level interconnect M2 made of an Al alloy. Instead of the TiN film, a single layer film of Ti (titanium) film, TiW (titanium tungsten) film, Ta (tantalum) film, W film or WN (tungsten nitride) film, or a laminate film thereof may be used.

With a resist film (not illustrated) as a mask, the TiN film M3a, Al film M3b and TiN film M3c are then dry etched to form a third-level interconnect M3. FIG. 4 is a cross-sectional view (cross-sectional view in an extending direction of the third-level interconnect M3) taken along a line A—A of FIG. 3 (this will equally apply to FIGS. 6 and 8).

Figure 5:
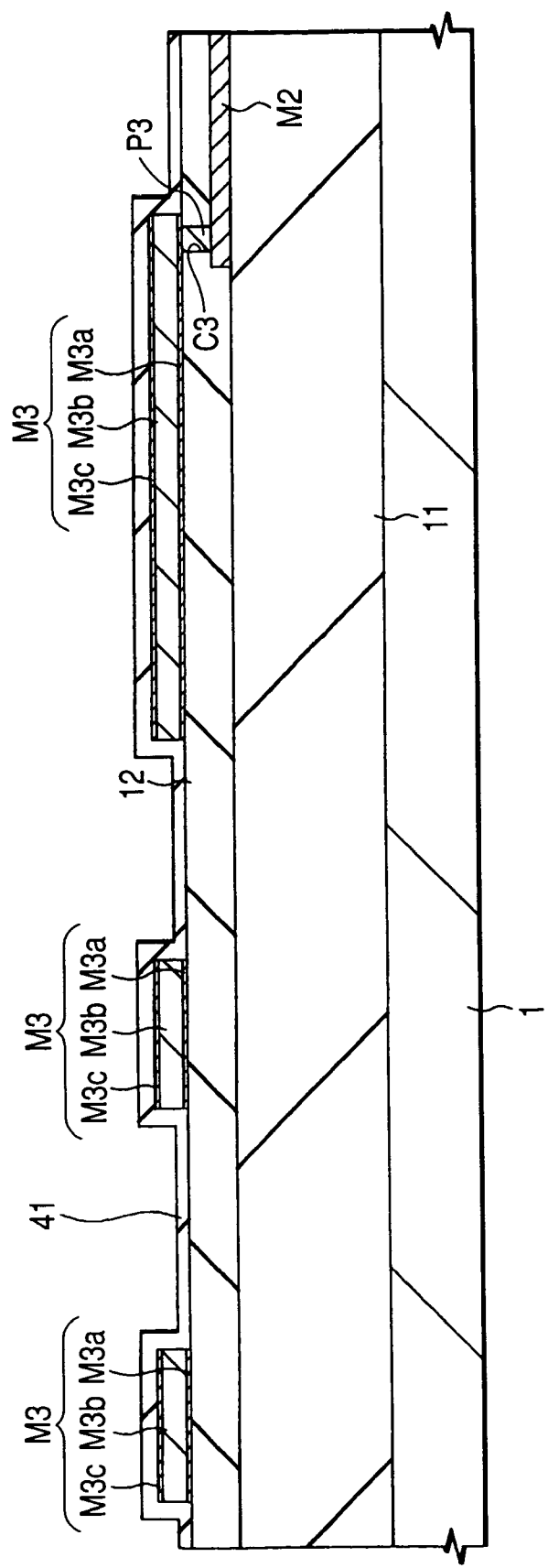
FIG. 5 is a fragmentary cross-sectional view of a substrate illustrating a manufacturing method of the semiconductor device according to the embodiment of the present invention.
Figure 6:
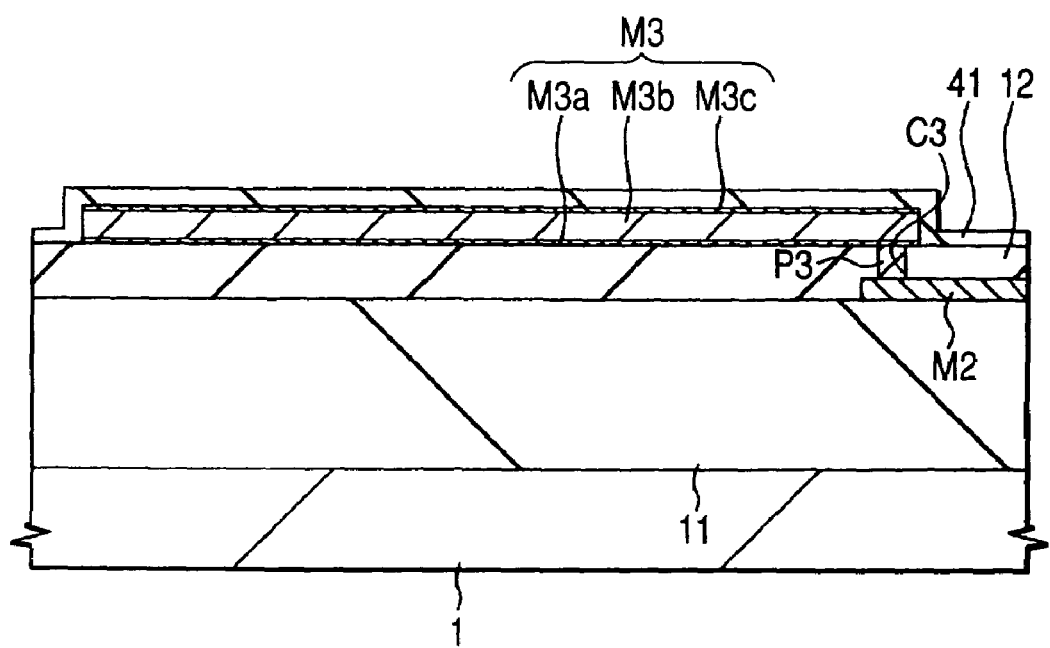
FIG. 6 is a fragmentary cross-sectional view of a substrate illustrating a manufacturing method of the semiconductor device according to the embodiment of the present invention.

As illustrated in FIGS. 5 and 6, a silicon nitride film and a silicon oxide film are deposited successively as protecting films over the third level interconnect M3, for example, by CVD to form a passivation film 41 made of their laminate. This passivation film 41 may be formed of a single layer.

Figure 7:
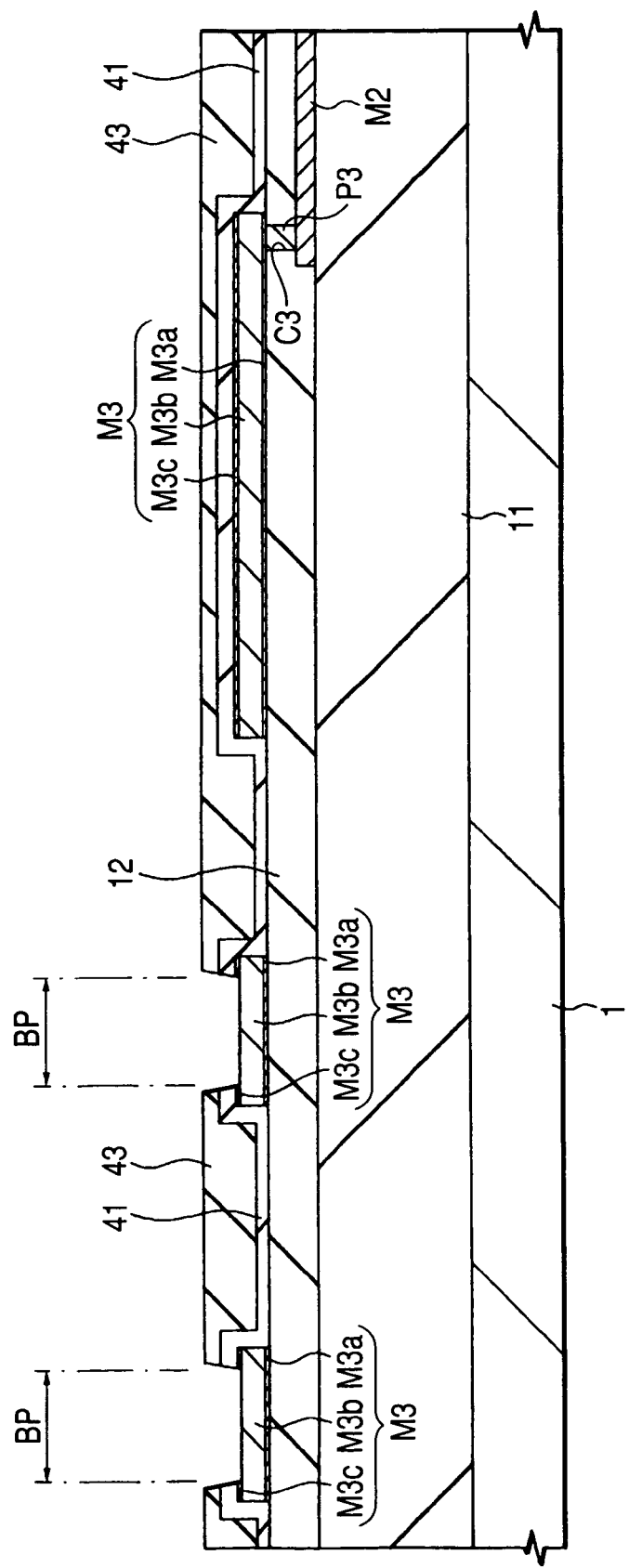
FIG. 7 is a fragmentary cross-sectional view of a substrate illustrating a manufacturing step of the semiconductor device according to the embodiment of the present invention.
Figure 8:
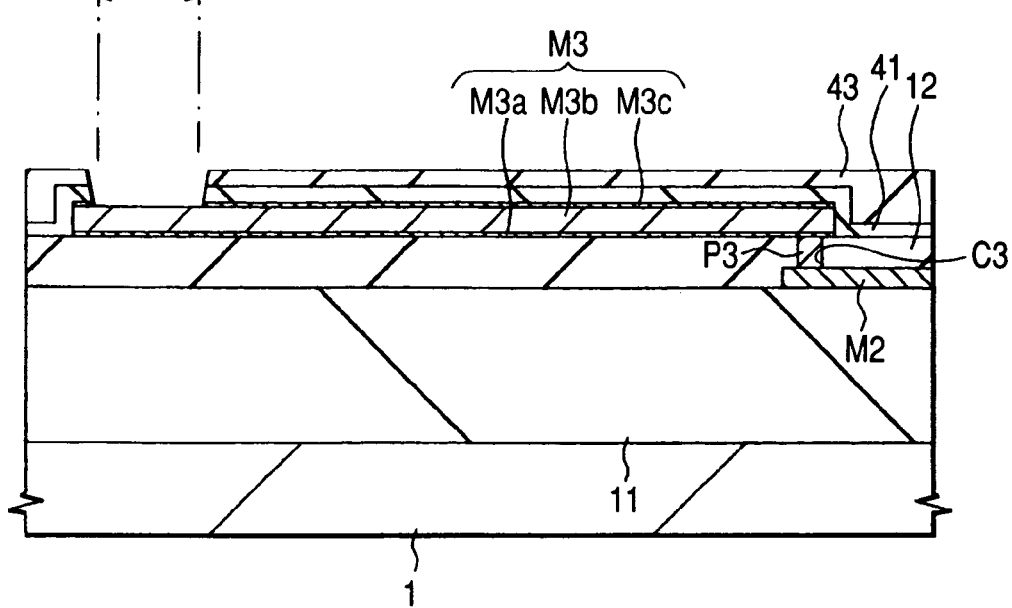
FIG. 8 is a fragmentary cross-sectional view of a substrate illustrating a manufacturing step of the semiconductor device according to the embodiment of the present invention.

As illustrated in FIGS. 7 and 8, a polyimide resin film 43 having an opening portion at a desired position is formed over the passivation film 41. This polyimide resin film 43 is formed by spin coating a photosensitive polyimide resin film to give a thickness of about 5 μm, heat treating (pre-baking) the film, exposing and developing the resulting polyimide resin film to form an opening, and then, heat treating (post-baking) the film to cure it.

Figure 9:
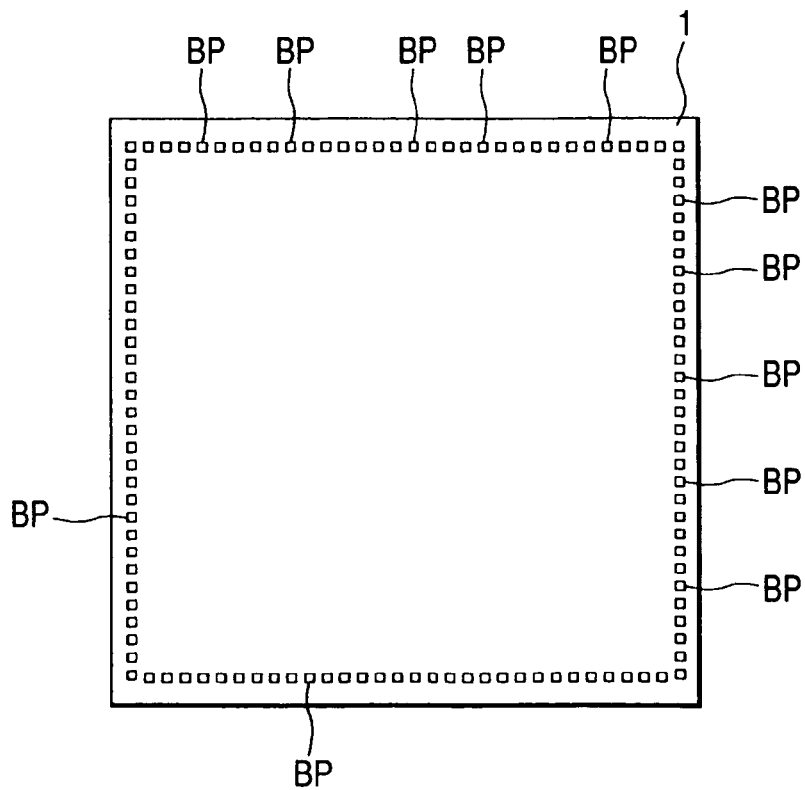
FIG. 9 is a fragmentary plane view of a substrate illustrating a manufacturing method of the semiconductor device according to the embodiment of the present invention.

With the resulting polyimide resin film 43 as a mask, the underlying passivation film 41 is dry etched, followed by dry etching of the TiN film M3c. As a result, a portion of the surface of the Al film M3b is exposed. This exposed region of the Al film M3b is called "bonding pad portion BP". FIG. 9 is a fragmentary plane view of a substrate (chip region) having the bonding pad portions BP formed thereover.

The steps so far described are often carried out in a so-called wafer state. In this case, the wafer (semiconductor substrate) having a plurality of substantially rectangular semiconductor chip regions is cut (diced) into each semiconductor chip.

In the next place, adhesion (first bonding) of a gold wire WR onto the bonding pad portion BP over the semiconductor chip is performed. This step will be described with reference to FIGS. 10 to 11.

Figure 10:
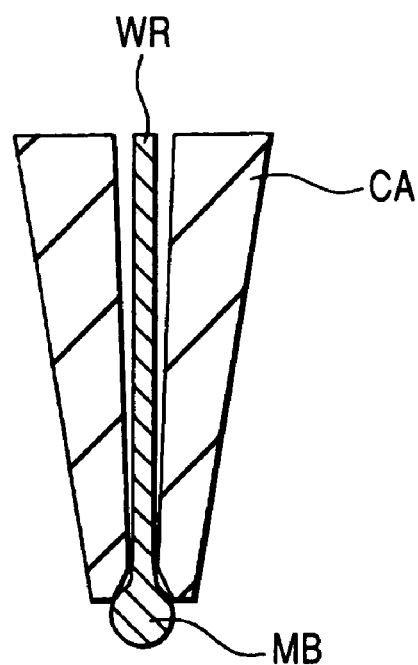
FIG. 10 illustrates a capillary to be used in a manufacturing step of the semiconductor device according to the embodiment of the present invention.

As illustrated in FIG. 10, a capillary CA having, along a shaft center thereof, a pore for causing a gold wire WR to pass therethrough is prepared and the gold wire WR is caused to pass through the inside of the capillary. A discharge energy from an electrode is then applied, using an electric torch (not illustrated), to the gold wire WR coming out from the tip of the capillary CA, whereby the gold wire WR is molten and a ball MB is formed.

Figure 11:
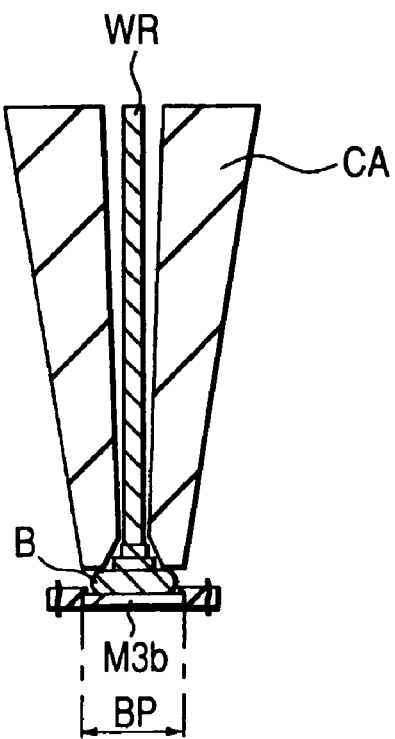
FIG. 11 is a fragmentary cross-sectional view of a substrate (bonding pad portion) illustrating a manufacturing step of the semiconductor device according to the embodiment of the present invention.
Figure 12:
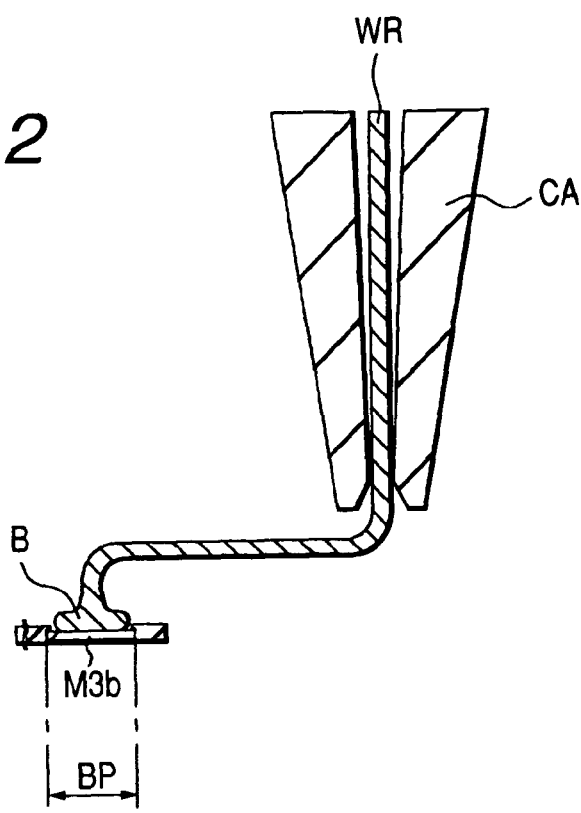
FIG. 12 is a fragmentary cross-sectional view of a substrate (bonding pad portion) illustrating a manufacturing step of the semiconductor device according to the embodiment of the present invention.

As illustrated in FIGS. 11 and 12, the molten ball MB is adhered onto the bonding pad portion BP. This adhesion step is carried out while applying pressure onto the molten ball MB from the capillary CA and applying ultrasonic waves to the capillary CA. During this treatment, the bonding pad portion BP is heated by a heater which is not illustrated. Such a treating method is called "ultrasonic thermo-compression bonding method". When the gold wire WR is pulled up after the treatment, the tip of the gold wire WR remains while being adhered onto the bonding pad portion BP. As illustrated in FIG. 12, the tip of the gold wire WR thus adhered is called "ball portion B" or "gold ball portion B". This gold ball portion B and bonding pad portion BP (Al film M3b) are bonded by the formation of an Al—Au alloy layer on the interface therebetween.

Figure 13:
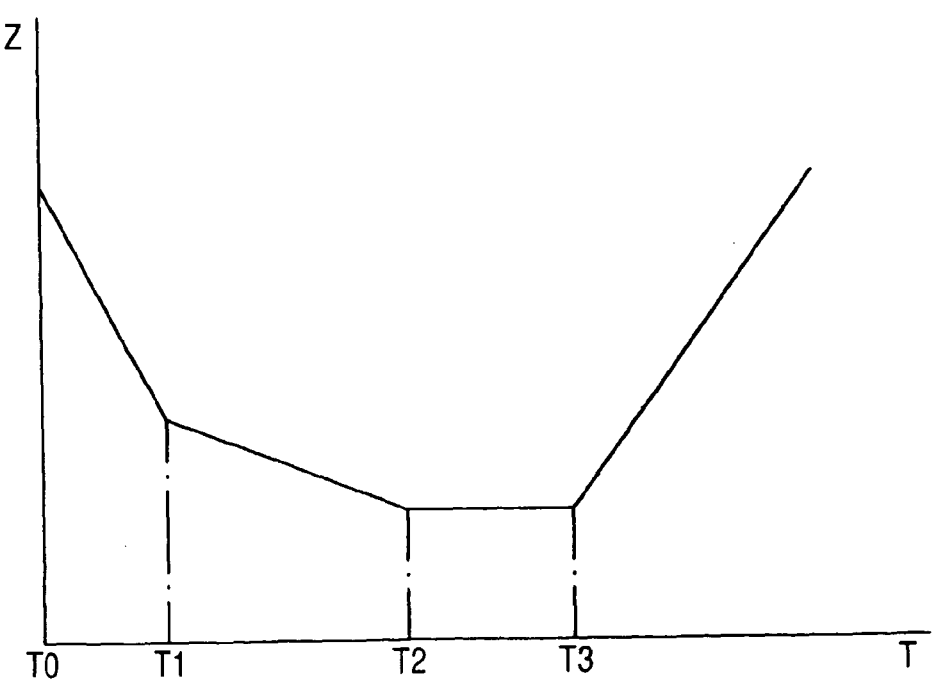
FIG. 13 is a graph showing the movement of the capillary to be used in a manufacturing step of the semiconductor device according to the embodiment of the present invention.
Figure 14:
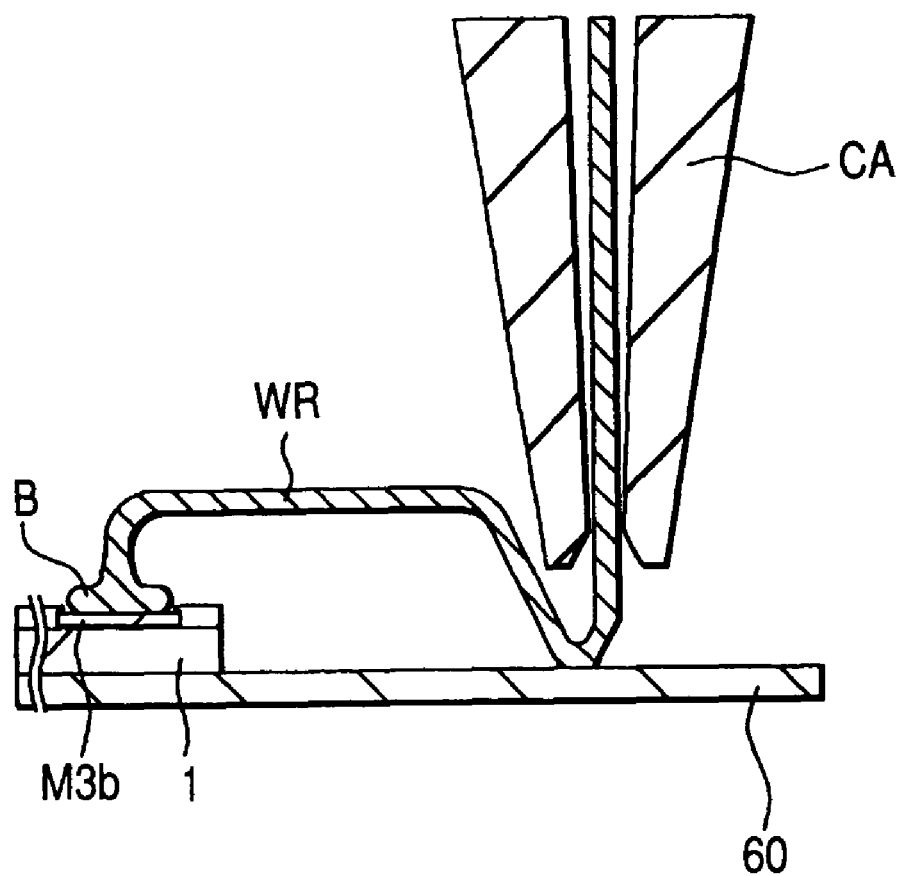
FIG. 14 is a fragmentary cross-sectional view of a substrate (bonding pad portion) illustrating a manufacturing step of the semiconductor device according to the embodiment of the present invention.

FIG. 13 shows the relationship between the height (Z) of the capillary CA and time (T). As illustrated in FIG. 13, the height of the capillary CA starts a decline at time T0, but this declining rate becomes smaller at time T1. During the term T2, the molten ball MB is mounted onto the bonding pad portion BP and this state is maintained for a predetermined term (T2 to T3). This term is called "bonding term". Then (on and after time T3), the height of the capillary CA shows an increase and the gold wire WR is pulled up. As illustrated in FIG. 14, ultrasonic thermo-compression bonding (second bonding) of the gold wire WR thus pulled up is performed onto, for example, a printed wiring (not illustrated) over the wiring substrate 60.

Here, the technique investigated by the present inventors will be described.

Figure 15:
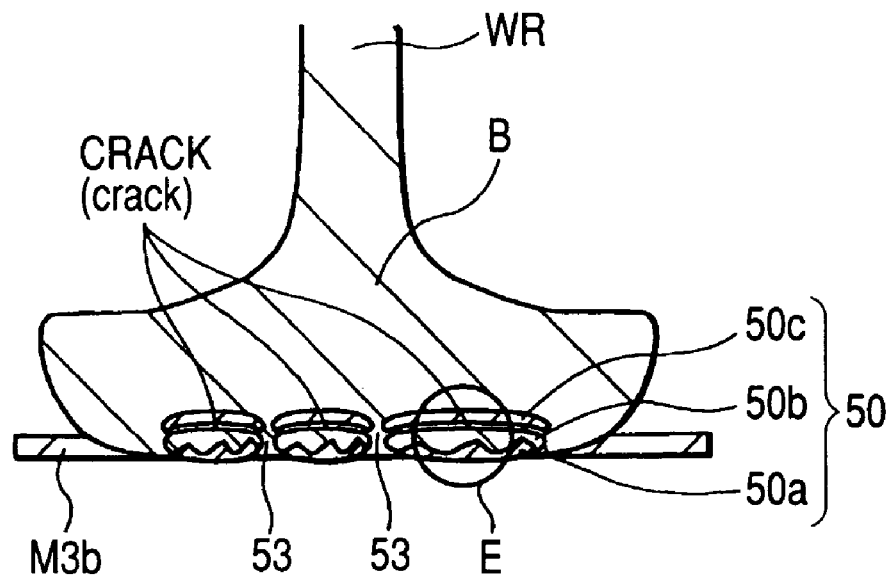
FIG. 15 is a fragmentary cross-sectional view of a bonding pad portion of the semiconductor device for explaining an advantage of the embodiment of the present invention.
Figure 16:
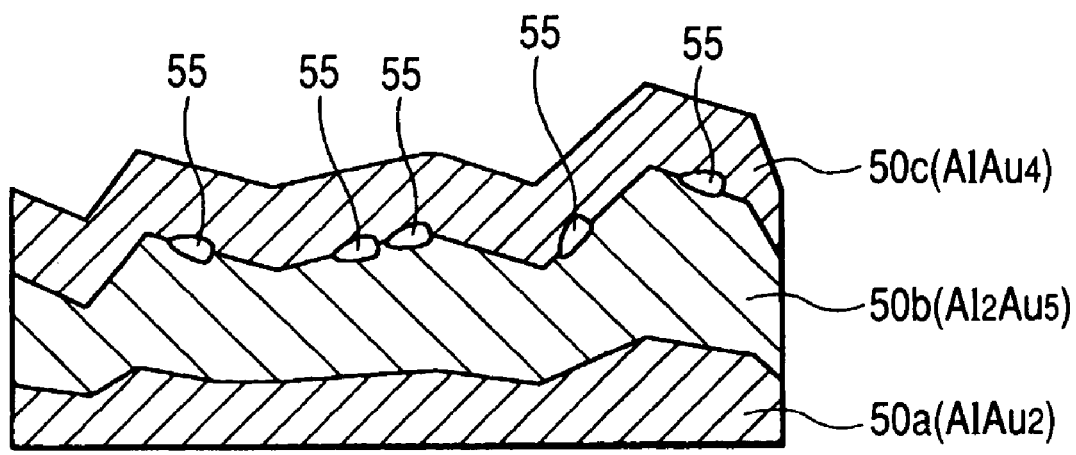
FIG. 16 is a fragmentary cross-sectional view of a bonding pad portion of the semiconductor device for explaining another advantage of the embodiment of the present invention.
Figure 17:
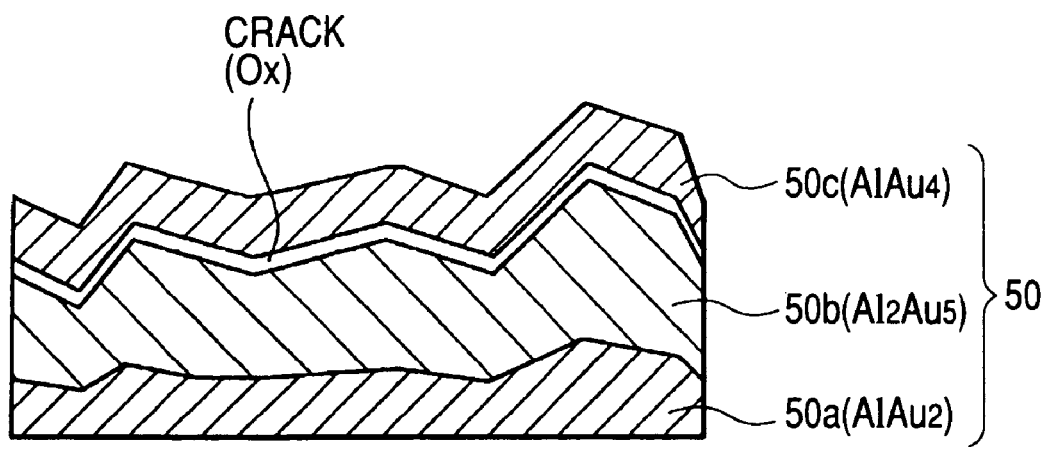
FIG. 17 is a fragmentary cross-sectional view of a bonding pad portion of the semiconductor device for explaining a further advantage of the embodiment of the present invention.

When the gold wire WR was bonded to the Al film M3b having a thickness (t) of about 700 nm, a short-circuit failure occurred after a temperature cycle test. As a result of searching the short-circuit site, it was found that cracks appeared in the Al—Au alloy layer 50 as illustrated in FIG. 15. Detailed analysis of the Al—Au alloy layer 50 following it revealed that the Al—Au alloy layer 50 was made of three layers. They were, from the bottom layer, an $AlAu_2$ film 50a, $Al_2Au_5$ film 50b and $AlAu_4$ film 50c (refer to FIGS. 16 and 17). It was also confirmed that on the interface between the gold ball portion B and bonding pad portion BP (Al film M3b), there existed a region 53 in which the Al—Au alloy layer 50 was not formed. Among the an $AlAu_2$ film 50a, $Al_2Au_5$ film 50b and $AlAu_4$ film 50c constituting the Al—Au alloy layer 50, $Al_2Au_5$ is most stable. FIGS. 16 and 17 are enlarged views of the circled region E of FIG. 15.

When the Al film M3b had a thickness as relatively large as about 1000 nm, existence of $AlAu_4$ was not confirmed. It is therefore presumed that a decrease in the thickness of the Al film M3b (interconnect) leads to a reduction in the feeding amount of Al, whereby the $AlAu_4$ film having a small Al composition ratio is formed on the side of the gold ball portion B.

Consequently, as illustrated in FIG. 16, disconformity of an alloying reaction appears between the $Al_2Au_5$ film 50b and AlAu$_4$ film 50*c* upon formation of the Al—Au alloy layer 50 and it becomes a void 55.

It is considered that a plurality of such voids which have been enlarged by the temperature cycle test form a crack as shown in FIG. 17, leading to a short-circuit failure. In the crack, an oxide Ox of Al or Au is formed, which is presumed to owe to a trace amount of oxygen contained in a sealing resin which will be described later.

As a countermeasure against such a short-circuit, a method of flattening the gold ball portion B with a higher pressure, thereby increasing the adhesion area of it with the Al film M3*b* can be considered. Flattening of the gold ball portion B with a high pressure however makes it impossible to ensure a short margin with the adjacent bonding pad or another gold ball thereon, resulting in an increase in the short-circuit failure. When the pitch of the bonding pad portion BP becomes smaller owing to the miniaturization of a semiconductor device, the above-described short-circuit failure becomes a serious problem. Flattening of the gold ball portion B with a high pressure sometimes gives a serious damage to the bonding pad, though depending on the bonding conditions.

Based on the above-described results, the present inventors investigated the shape of the gold ball portion B capable of maintaining a sufficient a bonding strength without causing a large change in the shape of the gold ball portion B and adjusting its changing amount within the specifications; and a production process thereof.

Figure 18:
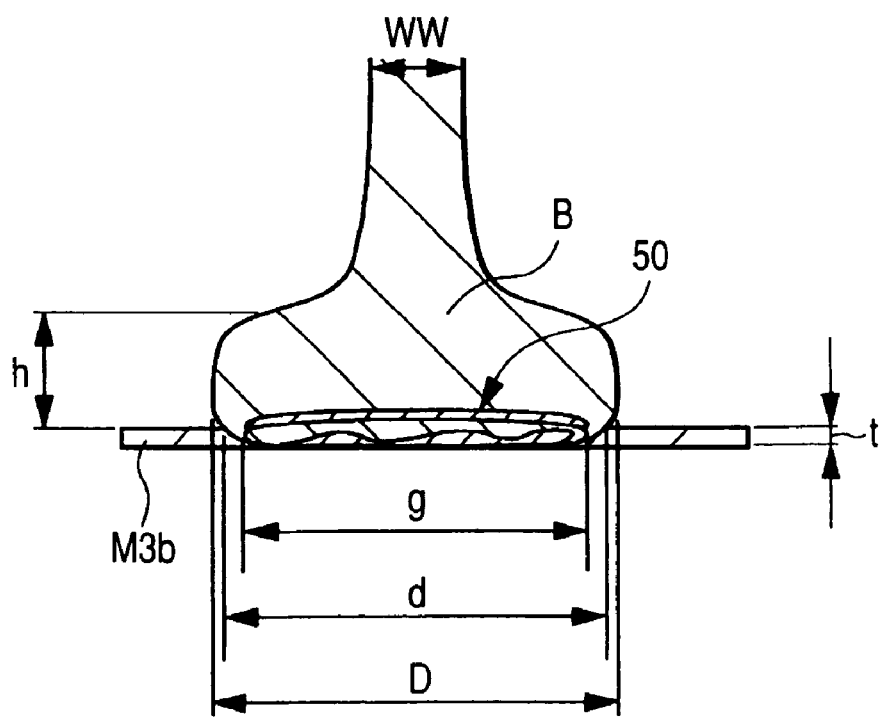
FIG. 18 is a fragmentary cross-sectional view of a bonding pad portion of the manufacturing process of a semiconductor device according to the embodiment of the present invention.

First, the shape of the gold ball portion B will be described with reference to FIG. 18. As illustrated in FIG. 18, the diameter d of the connected region of the gold ball portion B and the maximum peripheral diameter D of the gold ball portion B are adjusted to have the following relationship: $d \geq 0.8D$. The term "connected region Ad" means a contact region of the gold ball portion B with the Al film M3*b* (interconnect), while the term "diameter d of the connected region" means the diameter of the contact region of the gold ball portion B with the Al film M3*b* (interconnect).

By satisfying the above-described relationship, a short margin, in turn, a contact area can be secured.

The above-described relationship of $d \geq 0.8D$ corresponds to $Ad \geq 0.64D$ when expressed by the relationship between the connected region Ad of the gold ball portion B and a region defined by the maximum periphery of the gold ball portion B. The relationship preferably satisfies the following expression: $Ad \geq 0.7AD$ when fluctuations in the surface conditions of the pad portion upon production or fluctuations in the bonding conditions are taken into consideration.

The height (h) of the gold ball portion B preferably falls within a range of $9 \geq D/h \geq 2$. When D is 65 µm or less, the height is preferably 5 µm or greater but not greater than 15 µm. The diameter (width) WW of the gold wire is preferably 25 µm or less.

The diameter d of the connected region of the gold ball portion B and the diameter g of the Al—Au alloy layer 50 formed region are set to satisfy the following relationship: $g \geq 0.8d$.

When the above-described relationship is satisfied, a bonding strength between the gold ball portion B and the Al film M3*b* (interconnect) by the Al—Au alloy layer 50 can be ensured, whereby an influence of the above-described voids or cracks can be weakened, resulting in a reduction in bad connection.

The relationship of $g \geq 0.8d$ corresponds to $Ag \geq 0.64Ad$ when expressed by the relationship between the connected region Ad of the gold ball portion B and the region Ag in which the Al—Au alloy layer 50 has been formed. The data (FIG. 23) which will be described later suggest that it is more preferred that the relationship satisfies the following expression: $Ag \geq 0.7Ad$.

Even if the thickness of the Al film M3*b* is, for example, 700 nm or less and an alloy (AlAu$_4$) layer formed therewith has a small Al composition ratio, a bonding strength can be ensured.

When the Al film M3*b* is thin, the Al—Au alloy layer 50 extends even to the bottom of the Al film M3*b*. Accordingly, the TiN film M3*a* exists below the Al—Au alloy layer 50 (refer to FIG. 27).

In this Embodiment, the diameter d of the connected region, the maximum peripheral diameter D of the gold ball portion B and the diameter g of the Al—Au alloy layer 50 formed region are each not necessarily a diameter of a perfect circle but only be a line at the center of each of these regions.

Figure 19:
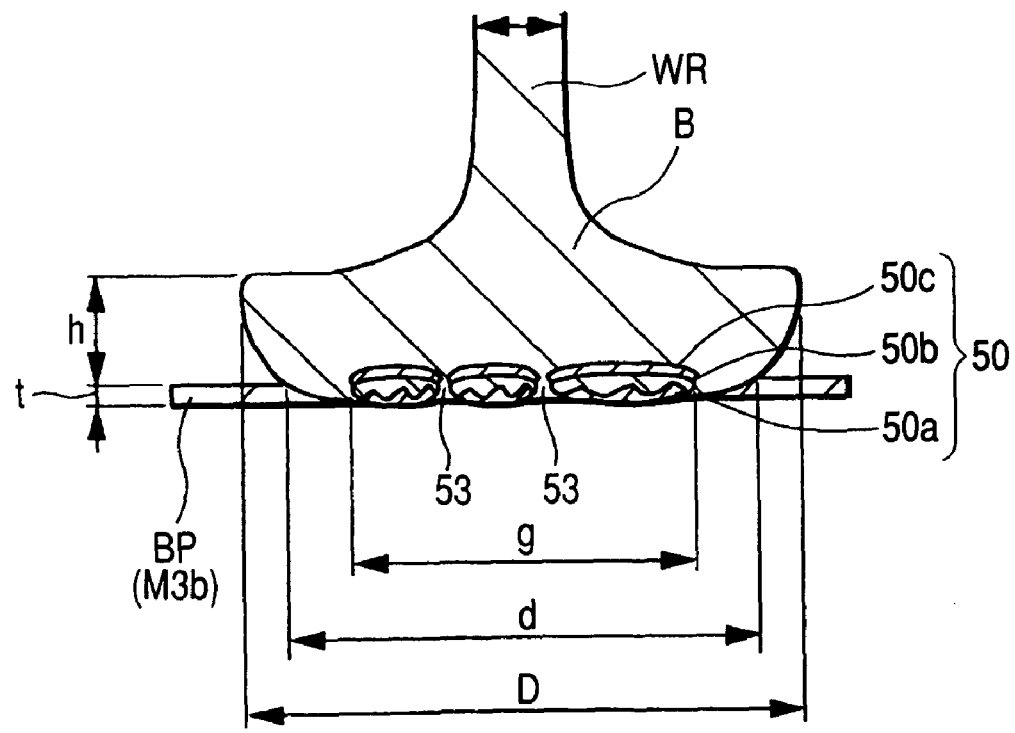
FIG. 19 is a fragmentary cross-sectional view of a bonding pad portion of the semiconductor device for explaining a further advantage of the embodiment of the present invention.

On the contrary, when the gold ball portion is bonded onto a thin Al film so as to give a desired contact-bonded ball diameter by setting a bonding temperature and bonding term similar to those investigated in the case where the Al film thickness was large and the pitch of the bonding pad portion was relatively large, but changing a capillary and gold wire diameter to meet a desired pad pitch (initial ball volume) and adjusting a bonding load and a ultrasonic applying output, the shape is formed as illustrated in FIG. 19.

In the above-described case, the relationship between the diameter d of the connected region of the gold ball portion B and the maximum peripheral diameter D of the gold ball portion B satisfied the following expression: $d \leq 0.8D$, while that between the diameter d of the connected region of the gold ball portion B and the diameter g of the Al—Au alloy layer 50 formed region satisfied the following expression: $d \leq 0.8d$.

It therefore becomes difficult to maintain a sufficient bonding strength between the gold ball portion B and the Al film M3*b* (interconnect) by the Al—Au alloy layer 50. Particularly when the Al film is thin, an AlAu$_4$ film having a small Al composition ratio is formed thick and cracks tend to appear on the interface of the AlAu$_4$ film owing to an influence of a temperature cycle test which will be made later.

Figure 20:
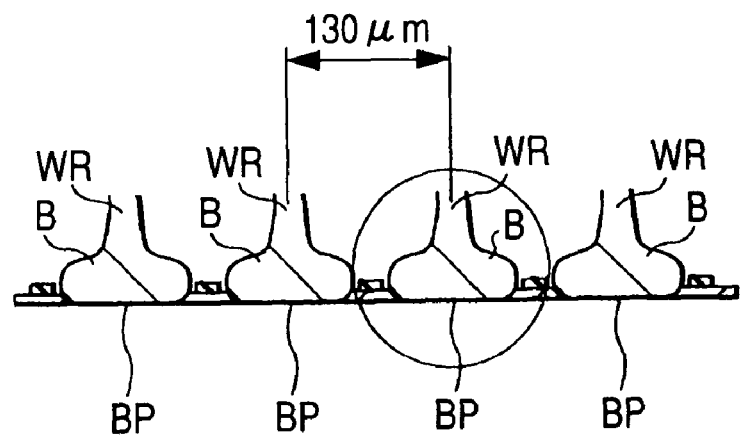
FIG. 20 is a fragmentary cross-sectional view of a bonding pad portion of the semiconductor device for explaining a further advantage of the embodiment of the present invention.

Such a phenomenon might occur when, for example, as illustrated in FIG. 20, the pitch of the bonding pad portion BP was 130 µm. It is however presumed that in this case, a short-circuit failure was avoided because an absolute diameter of the connected region or the Al—Au alloy layer formed region was maintained large. The term "pitch of the bonding pad portions BP" means a distance between the centers of any two adjacent bonding pads BP.

When the ball portion B as illustrated in FIG. 19 is reduced, as is, in size and is applied to a narrow pitch (for example, 70 µm or less), a bad connection occurs. If a connected region is ensured without changing such shape, an excessively large difference between the diameter d of the connected region of the gold ball portion B and the maximum peripheral diameter D of the gold ball portion B causes a short-circuit failure.

The constitution according to the present embodiment as illustrated in FIG. 18, on the other hand, makes it possible to maintain a sufficient bonding strength between the gold ball portion B and the Al film M3*b* (interconnect) by the Al—Au alloy layer and at the same time, to maintain a sufficiently short margin. The constitution of the present embodiment is particularly effective when applied to the bonding pad portions BP of a narrow pitch or bonding pad portion BP on a thin Al film (interconnect).

In the next place, one example of a bonding step for the formation of a gold ball as illustrated in FIG. 18 will be described.

For example, ultrasonic waves of 110 kHz or greater are applied during a bonding term (from T2 to T3 of FIG. 13) during which the molten ball MB is mounted on the bonding pad portion BP.

Figure 21:
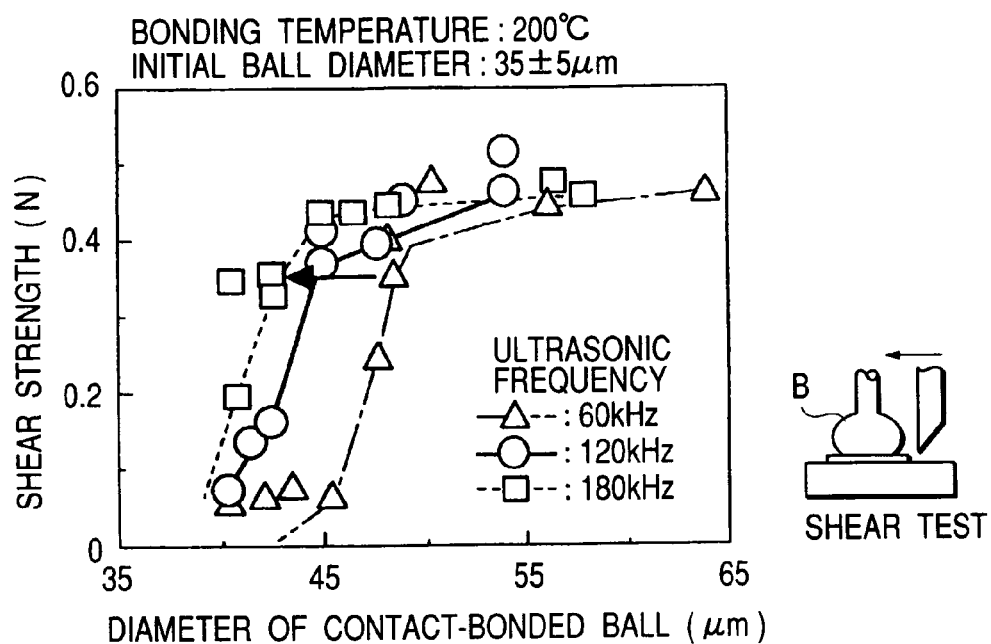
FIG. 21 is a graph showing the relationship between the diameter ($\mu$m) of the contact-bonded ball portion and shear strength (N) at varied ultrasonic frequencies.

FIG. 21 illustrates the relationship between the diameter ($\mu$m) of the contact-bonded ball portion and shear strength (N) at each ultrasonic frequency. The bonding temperature was set at 200° C., while the initial ball diameter was set at 35±5 $\mu$m. The term "shear strength (N)" means a stress at which peeling of the ball portion B occurs when the stress applied horizontally to the ball portion B is increased.

As illustrated in FIG. 21, shear strength becomes greater when ultrasonic waves of frequency 120 kHz or 180 kHz are applied than when those of frequency 60 kHz are applied. Between 120 kHz and 180 kHz, the shear strength is a little greater at the latter ultrasonic frequency. At frequency of 60 kHz, shear strength is 0.35 N when the contact-bonded ball diameter is about 50 nm, while at frequency of 180 kHz, shear strength of the same level (0.35 N) can be attained even when the contact-bonded ball diameter is as small as about 42 $\mu$m.

Figure 22:
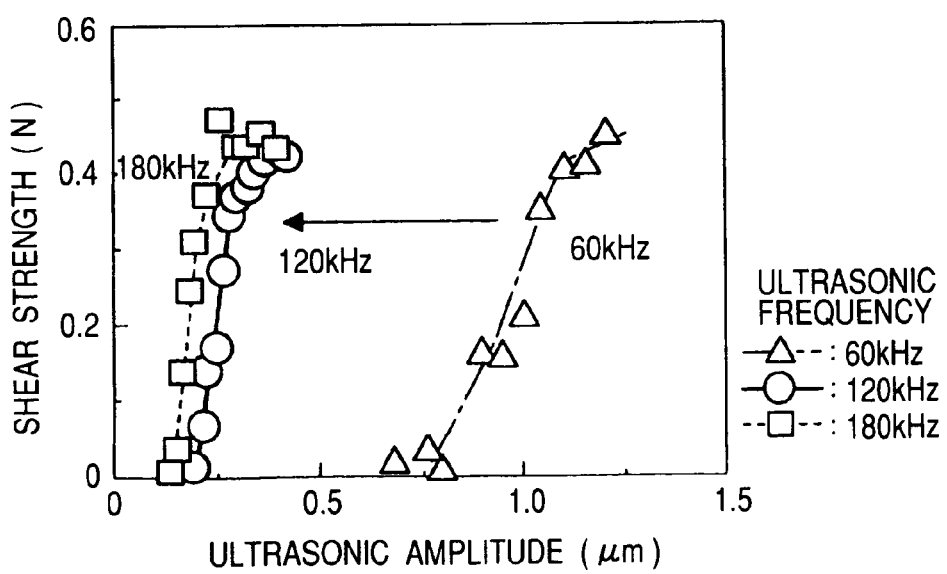
FIG. 22 is a graph showing the relationship between ultrasonic amplitude ($\mu$m) and shear strength (N) at varied ultrasonic frequencies.

FIG. 22 illustrates the relationship between ultrasonic amplitude ($\mu$m) and shear strength (N) at each ultrasonic frequency. As illustrated in FIG. 22, the greater the frequency, the amplitude becomes smaller, suggesting a point amplitude. A reduction in amplitude ($\mu$m) brings about an effect for reducing a bonding damage.

Figure 23:
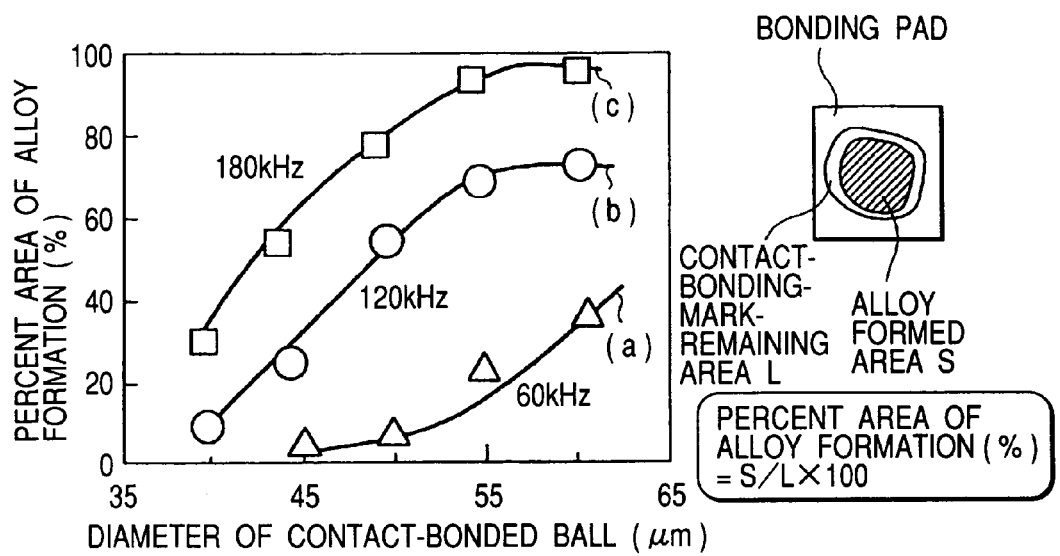
FIG. 23 is a graph showing the relationship between the diameter ($\mu$m) of the contact-bonded ball portion and the percent (%) of the alloy formed area at varied ultrasonic frequencies.

From the results of the shear test as illustrated in FIG. 21, the relationship between the diameter ($\mu$m) of the contact-bonded ball portion and percent (%) of the alloy formed area was studied. The results are shown in FIG. 23. The term "percent of the alloy formed area" means a percent (%) of the alloy formed area in the contact-bonding-mark-remaining area L which had appeared on the bonding pad portion BP as a result of the shear test.

As illustrated in FIG. 23, the percent (%) of the alloy formed area is greater when ultrasonic waves of frequency 120 kHz (graph (b)) or 180 kHz (graph (c)) are applied than when those of frequency 60 kHz are applied (graph (a)). Between 120 kHz and 180 kHz, the percent (%) of the alloy formed area is greater at the latter ultrasonic frequency. When ultrasonic waves of frequency 180 kHz are applied, the percent (%) of the alloy formed area reaches at least 70% even if the diameter of the contact-bonded ball ranges from about 65 $\mu$m to 50 $\mu$m, while at ultrasonic frequency of 120 kHz, the percent (%) of the alloy formed area reaches about 70% even if the diameter of the contact-bonded ball ranges from about 65 $\mu$m to 55 $\mu$m.

Figure 25:
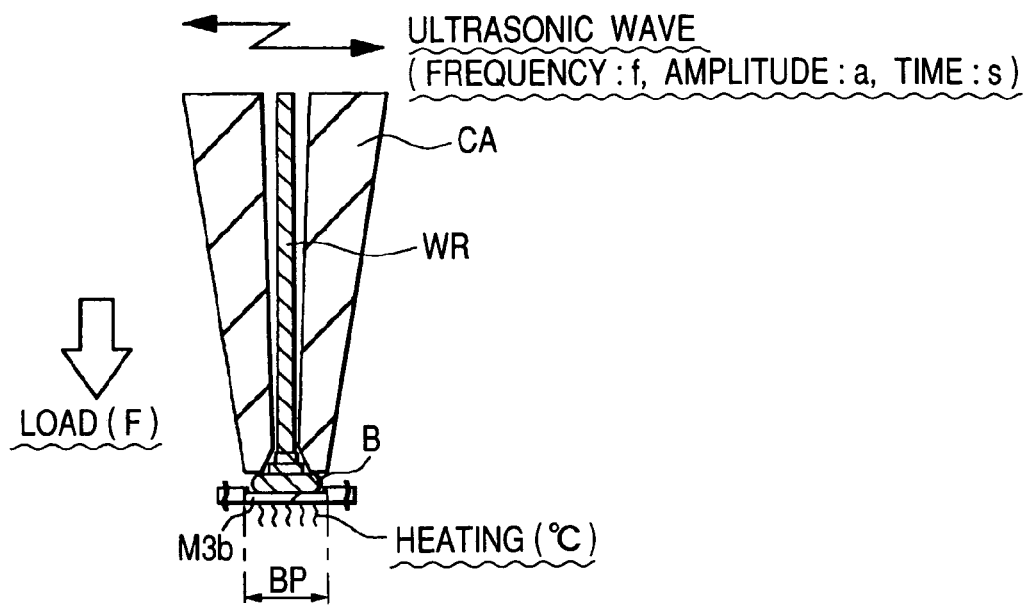
FIG. 25 is a fragmentary cross-sectional view of a substrate (bonding pad portion) illustrating a manufacturing step of the semiconductor device according to the embodiment of the present invention.

The gold ball portion B or Al—Au alloy layer having a constitution as illustrated in FIG. 18 were formed by increasing the ultrasonic frequency. Factors shown in FIG. 25 are considered to be able to regulate the shape of the gold ball portion B or Al—Au alloy layer.

For example, the factors relating to ultrasonic waves include, as well as frequency (f), amplitude (a) and time (s) of applying ultrasonic waves. Additional examples include load (F) applied by capillary and heating temperature (° C.) of the bonding pad portion BP.

Figure 26:
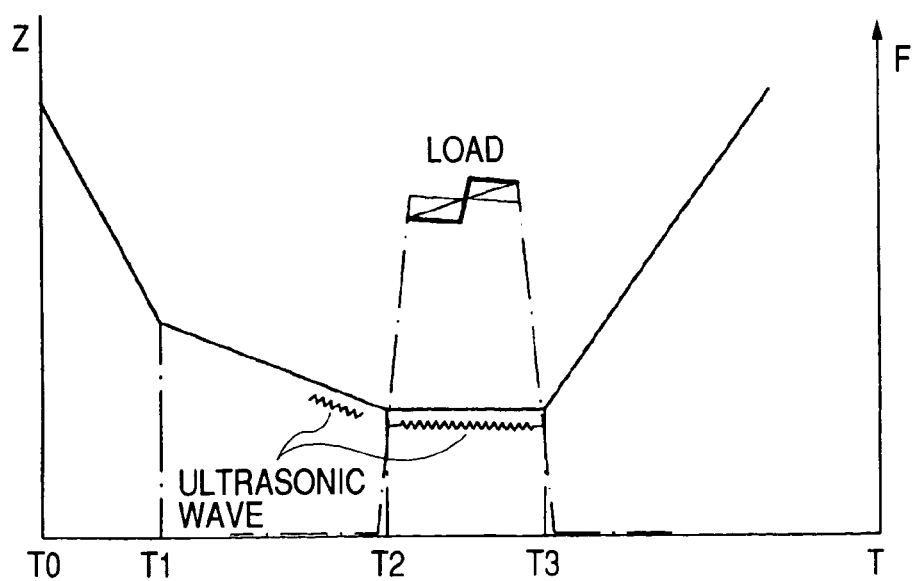
FIG. 26 is a graph illustrating the movement of a capillary to be used in a manufacturing step of the semiconductor device according to the embodiment of the present invention.

Specific possible methods include increase of ultrasonic frequency, gradual or stepwise raise in load (F) by capillary (A) during bonding term (from T2 to T3), shortening or extension of the application time of ultrasonic waves, starting of application of ultrasonic waves before the bonding time, and use of these methods in combination (refer to FIG. 26).

Figure 24:
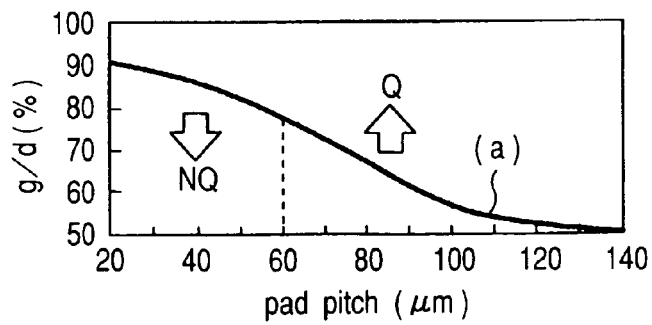
FIG. 24 is a graph showing the relationship between the pitch of the bonding pad portion and a ratio (g/d) of the diameter g of the Al—Au alloy layer formed region to the diameter d of the connected region of the gold ball portion B.

FIG. 24 illustrates the relationship between the pitch (pad pitch) of the bonding pad portion and percent (g/d) of the diameter g of the Al—Au alloy layer formed region to the diameter d of the connected region of the gold ball portion B. The upper region of the graph (a) indicates a region Q in which reliability of the gold ball portion B can be secured, while the lower region of the graph (a) indicates a region NQ in which a short-circuit failure occurs. The thickness of the Al film is set at 700 nm.

As illustrated in FIG. 24, when percent (g/d) is 80% or greater, the reliability can be secured even at a bonding pad pitch of 60 $\mu$m or less.

Figure 27:
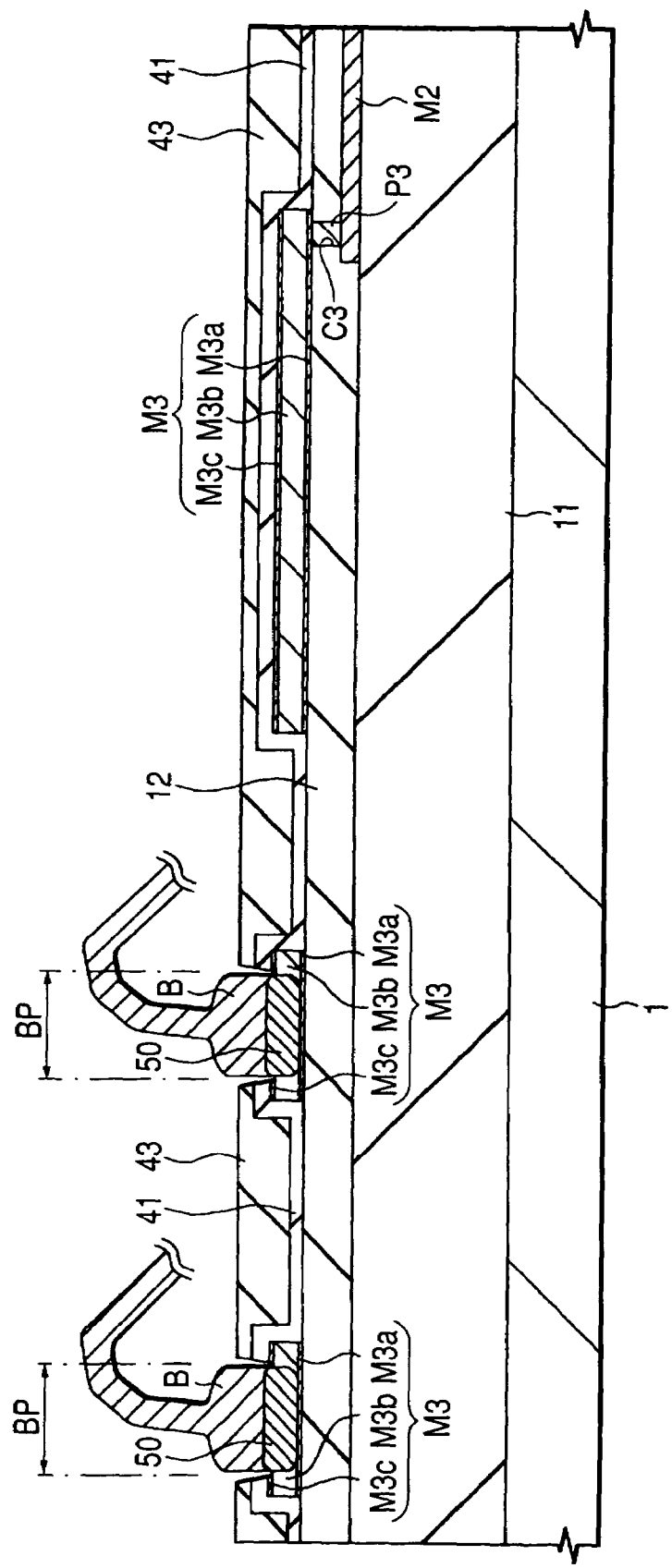
FIG. 27 is a fragmentary cross-sectional view of a substrate illustrating a manufacturing step of the semiconductor device according to the embodiment of the present invention.

FIG. 27 is a fragmentary cross-sectional view of a substrate after adhesion (first bonding) of the gold wire WR onto the bonding pad portion BP.

Figure 28:
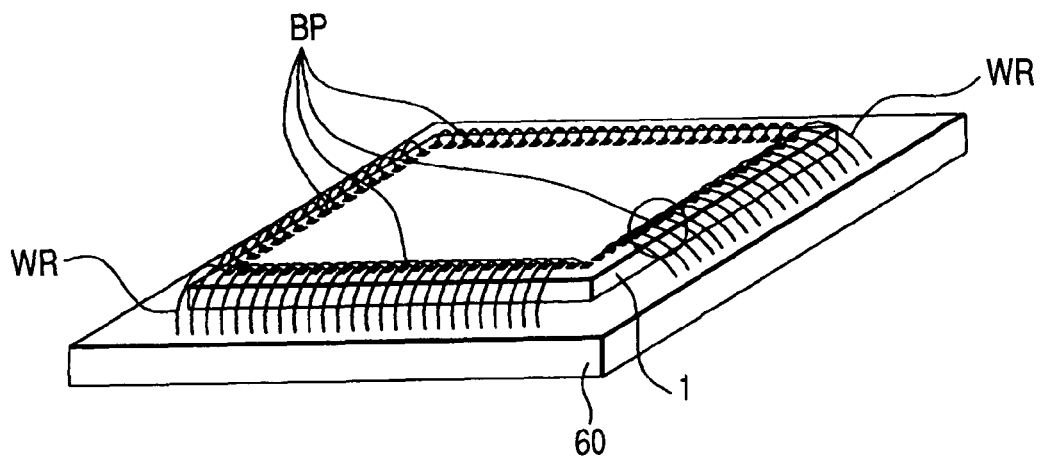
FIG. 28 is a perspective view of a substrate illustrating a manufacturing step of the semiconductor device according to the embodiment of the present invention.
Figure 29:
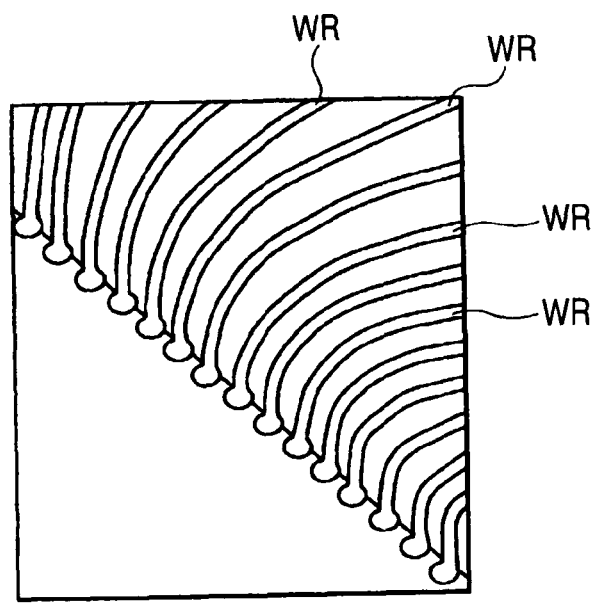
FIG. 29 is a partially enlarged view of FIG. 28 illustrating a manufacturing step of the semiconductor device according to the embodiment of the present invention.

As described with reference to FIG. 14, the gold wire WR is subjected to ultrasonic thermo-compression bonding (second bonding) onto the printed wiring WR (not illustrated) over the wiring substrate 60 such as glass.epoxy. FIG. 28 illustrates the state (perspective view) of the IC chip (1) and the wiring substrate 60 after second bonding, while FIG. 29 is a fragmentary enlarged view of the circled portion of FIG. 28.

Figure 30:
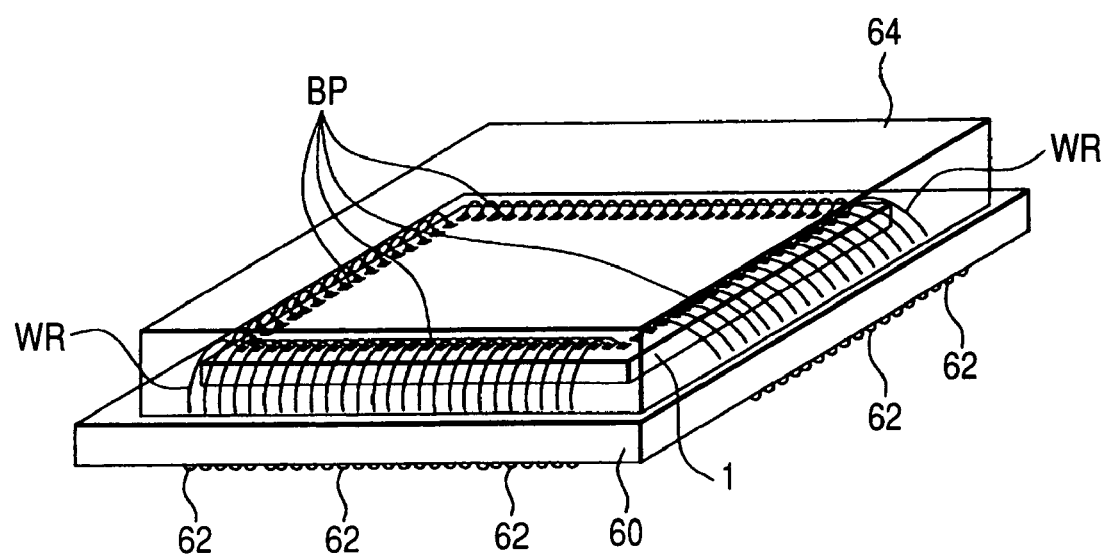
FIG. 30 is a perspective view of a substrate illustrating a manufacturing process of the semiconductor device according to the embodiment of the present invention.

Then, as illustrated in FIG. 30, the gold wire WR and IC chip are sealed, at the periphery thereof, by a resin sealant 64. The resin sealant 64 is, for example, formed by a transfer mold method, in which a molten resin is poured into a metal mold which holds therewith the wiring substrate 60 tightly, followed by curing and sealing. As the resin, for example, an epoxy series thermosetting resin containing silica as a filler is usable.

Upon pouring or curing of this resin, stress is applied to the gold wire WR or the ball portion B thereof. In this Embodiment, the relationship between the diameter d of the connected region of the gold ball portion B and the diameter of the Al—Au alloy layer 50 formed region is set at g≧0.8d so that a bonding strength between the gold ball portion B and the Al film M3b (interconnect) by the Al—Au alloy layer 50 can be ensured.

After formation of the resin sealant 64, a bump electrode 52 is formed on the back side of the wiring substrate 60. This bump electrode is not illustrated, but is connected to a back-side electrode formed on the back side of the wiring substrate 60.

The back-side electrode is electrically connected with the gold wire WR via an inside wiring of the wiring substrate 60. The bump electrode 62 is not illustrated, but is employed for the purpose of electrical connection with a packaged substrate on which a plurality of electronic parts are mounted for the use, for example, for a handy phone. The package form as illustrated in FIG. 30 is called "BGA" (ball grid array).

Then, in order to guarantee the product life, quality tests such as temperature cycle test are conducted using a sample which is not shipped. In this temperature cycle test, after thermal history (260° C.×10s×three times) upon customer packaging, a semiconductor device is exposed to high temperature of 150° C. for 10 minutes, and then low temperature of −55° C. for 10 minutes. This cycle is repeated 1000 times (1000 cycles).

At this test, a thermal deformation degree is different between the resin 64 and IC chip (1), reflecting the difference in a thermal expansion coefficient among the resin 64, IC chip (1) and the wiring substrate 60. As a result, a stress is applied onto the gold ball portion B at every cycle.

In this Embodiment, however, the relationship between the diameter d of the connected region of the gold ball portion B and the diameter g of the Al—Au alloy layer 50 formed region is set at g≧0.8 so that a sufficient bonding strength between the gold ball portion B and the Al film M3b (interconnect) by the Al—Au alloy layer 50 can be secured, leading to prevention of a short-circuit due to stress.

Even if the Al film M3b (interconnect) is formed thin and a portion not resistant to stress appears by the formation of an AlAu$_4$ film, a bonding strength can be ensured, whereby a short-circuit can be prevented. As a countermeasure against formation of the AlAu$_4$ film, stacking of an Al film on the bonding pad portion BP prior to the first bonding of the gold wire WR can be considered. In this case, however, stacking of an Al film makes the production process complex. According to this Embodiment, on the other hand, complication of the step owing to stacking of another Al film can be avoided.

It is the common practice to form the bonding pad and wiring patterns other than the bonding pad simultaneously. Application of this Embodiment makes it possible to attain sufficient bonding strength even if the Al film is thin enough to be advantageous for the narrowing of the wiring width on the IC chip.

This makes it possible to form more minute patterns, thereby improving an integration degree of a chip, increasing the number of chips which can be formed per wafer, and reducing a production cost.

Even if the bonding pad portion BP becomes smaller with an increase in the number of pins owing to miniaturization or function diversification of a semiconductor device, the bonding strength can be ensured and short-circuit can be prevented.

In addition, even if the pitch of the bonding pad portion BP becomes smaller with an increase in the number of pins owing to miniaturization or function diversification of a semiconductor device, the bonding strength can be ensured and short-circuit can be prevented.

When the relationship between the diameter d of the connected region of the gold ball portion B and the maximum peripheral diameter D of the gold ball portion B is set to satisfy the following expression: $d \geq 0.8D$, a short margin for a gold ball portion can be ensured even if the pitch of the bonding pad portion BP becomes small with an increase in the number of pins owing to miniaturization or function diversification of a semiconductor device.

The present invention made by the present inventors were described specifically based on Embodiment. The present invention is not limited to the above-described embodiment and it is needless to say that it can be modified within an extent not departing from the gist of the present invention.

Particularly in the above-described embodiment, the present invention was applied to the bonding of the Al film and the gold ball portion B. It can also be applied widely to a semiconductor device in which a metal interconnect and a metal ball portion (which may be a bump electrode) are bonded by forming an alloy layer between the metals thereof.

This embodiment can be applied not only to BGA but also to a semiconductor device such as QFP (quad flat package) using a lead frame.

Of the inventions disclosed by the present application, effects available by the typical ones will be described briefly below.

Upon bonding of a first metal film formed above a semiconductor chip and a ball portion made of a second metal by an alloy layer of the first metal and the second layer, since the relationship between the diameter d of the contact region of the first metal film with the ball portion and the diameter g of the alloy layer formed region is set to satisfy the following expression: $g \geq 0.8d$; and the diameter of the contact region and the maximum peripheral diameter D of the ball is set to satisfy the following expression: $d \geq 0.8D$, adhesion between an interconnect having the first metal film and the ball portion can be ensured.

In addition, the reliability of the semiconductor device can be improved.

Moreover, the yield of the semiconductor device can be improved.

Although it is the common practice to form the bonding pad and wiring patterns other than the pad at the same time, use of the constitution of the present embodiment makes it possible to attain a sufficient bonding strength even when the Al film is a thin enough to be advantageous for narrowing of the wiring width on the IC chip.

The integration degree of a chip can be improved by forming more minute patterns, which can increase the number of chips available per wafer and reduce the production cost.

What is claimed is:

1. A manufacturing method of a semiconductor device, comprising the steps of:
    (a) forming a first metal film above a semiconductor chip region;
    (b) forming over said first metal film an insulating film having an opening at a pad portion over said first metal film; and
    (c) adhering a ball portion made of a second metal onto said pad portion such that part of said ball portion reaches the bottom of said pad portion by means of ultrasonic thermo-compression bonding at an ultrasonic frequency of 110 kHz or greater,
    wherein said ultrasonic frequency is applied before said ball portion comes in contact with said pad portion; and
    wherein a load is applied to said ball portion and is stepwise raised while applying said ultrasonic frequency.

2. A manufacturing method of a semiconductor device according to claim 1, further comprising the step of, after said step (c):
    (d) covering and sealing said ball portion with a resin.

3. A manufacturing method of a semiconductor device, comprising the steps of:
    (a) forming a first metal film above a semiconductor chip region;
    (b) forming over said first metal film an insulating film having an opening at a pad portion over said first metal film;
    (c) upon formation of a ball portion made of a second metal over said first metal film such that part of said ball portion reaches the bottom of said first metal film, forming an alloy layer of said first metal and said second metal in at least 70% of a contact region of said first metal film with said ball portion, thereby adhering said ball portion onto said first metal film, and adjusting the shape of said ball portion so that a diameter d of said contact region and a maximum peripheral diameter D of said ball portion satisfy the following expression: $d \geq 0.8D$; and
    (d) covering and sealing said ball portion with a resin,
    wherein ultrasonic frequency is applied before said ball portion comes in contact with said first metal film; and
    wherein a load is applied to said ball portion and is stepwise raised while applying said ultrasonic frequency.

* * * * *